(12) United States Patent
Lih et al.

(10) Patent No.: US 7,672,187 B2
(45) Date of Patent: Mar. 2, 2010

(54) ELASTIC POWER FOR READ AND WRITE MARGINS

(75) Inventors: Yolin Lih, San Jose, CA (US); Ajay Bhatia, Santa Clara, CA (US); Dennis Wendell, Sunnyvale, CA (US); Jun Liu, Santa Clara, CA (US); Daniel Fung, Santa Clara, CA (US); Shyam Balasubramanian, Santa Clara, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 194 days.

(21) Appl. No.: 11/932,967

(22) Filed: Oct. 31, 2007

(65) Prior Publication Data

US 2008/0186791 A1    Aug. 7, 2008

(51) Int. Cl.
G11C 5/14 (2006.01)
(52) U.S. Cl. .................. 365/226; 365/154; 365/156
(58) Field of Classification Search ............ 365/226, 365/154, 156
See application file for complete search history.

(56) References Cited

U.S. PATENT DOCUMENTS

| 5,870,331 | A | 2/1999 | Hwang et al. |
| 6,635,936 | B1 | 10/2003 | Wuu et al. |
| 6,771,095 | B1 | 8/2004 | Dunlea et al. |
| 7,502,275 | B2 * | 3/2009 | Nii et al. .............. 365/226 |
| 2004/0217448 | A1 | 11/2004 | Kumagai et al. |
| 2006/0268626 | A1 | 11/2006 | Hamzaoglu et al. |
| 2007/0013428 | A1 * | 1/2007 | Vadi et al. ............. 327/293 |
| 2007/0030741 | A1 | 2/2007 | Nii et al. |

FOREIGN PATENT DOCUMENTS

WO      2007018780      2/2007

OTHER PUBLICATIONS

V. Degalahal et al, "Soft Errors Issues in Low-Power Caches," IEEE Transactions on VLSI Systems, vol. 13, No. 10, Oct. 2005, pp. 1157-1166.
V. Degalahal et al, "Analyzing Soft Errors in Leakage Optimized SRAM Design," Proceedings of the 16th International Conference on VLSI Design, Jan. 4-8, 2003, pp. 1-7.
Y. Lih et al, "A Leakage Current Replica Keeper for Dynamic Circuits," IEEE Journal of Solid-State Circuits, vol. 42, No. 1, Jan. 2007, pp. 48-55.

(Continued)

*Primary Examiner*—Huan Hoang
(74) *Attorney, Agent, or Firm*—Osha • Liang LLP

(57) ABSTRACT

An elastic power header device and methods of operation are provided to improve both the read and the write margin of static random access memory (SRAM) cells by increasing read stability, reducing read disturbance and improving the Signal to Noise Margin (SNM) figure of merit. For example, various implementations of an elastic power header device are utilized as programmable resistances to permit the power supply lines to reach a maximum voltage. Allowing the power supply lines to reach the reference voltage allows more flexibility in read margin, write margin and read stability. Furthermore, this additional flexibility can be controlled by means for adjusting a voltage. This adjustment voltage can fine-tune the programmable resistances so that the read margin and the write margin can be more conveniently controlled.

35 Claims, 6 Drawing Sheets

OTHER PUBLICATIONS

M. Yamaoka et al, "90-nm Process-Variation Adaptive Embedded SRAM Modules with Power-Line-Floating Write Technique," IEEE Journal of Solid-State Circuits, vol. 41, No. 3, Mar. 2006, pp. 705-711.

K. Zhang et al, "A 3-GHz 70-Mb SRAM in 65-nm CMOS Technology with Integrated Column-Based Dynamic Power Supply," IEEE Journal of Solid-State Circuits, vol. 41, No. 1, Jan. 2006, pp. 146-151.

N. Mokhoff, "Digital Designer's Plight Debated at ISSCC," http://www.eetimes.com/showArticle.jhtml?articleID=179101341, Feb. 7, 2006, pp. 1-2.

E. Seevinck et al, "Static-Noise Margin Analysis of MOS SRAM Cells," IEEE Journal of Solid-State Circuits, vol. SC-22, No. 5, Oct. 1987, pp. 748-754.

B. Calhoun and A. Chandrakasan, "Analyzing Static Noise Margin for Sub-threshold SRAM in 65nm CMOS," Proceedings of ESSCIRC, Sep. 2005, pp. 363-366.

International Search Report for International Application No. PCT/US2006024680, dated Jan. 12, 2006, pp. 1-3.

M. Horstmann et al, "Advanced Transistor Structures for High Performance Microprocessors," International Conference on Integrated Circuit Design and Technology, May 17-20, 2004, pp. 65-61.

H. S. Yang et al, "Dual Stress Liner for High Performance sub-45nm Gate Length SOI CMOS Manufacturing," IEDM Technical Digest, Dec. 13-15, 2004, pp. 1075-1077.

PCT International Preliminary Report on Patentability dated Aug. 13, 2009, 7 pages.

* cited by examiner

Gated Power for Write Margin

600

700

ELASTIC POWER FOR READ AND WRITE MARGINS

BACKGROUND OF THE INVENTION

Static random access memory (SRAM) cells can be implemented using cross-coupled logic gates which maintain logic states representing data values. Ideally, SRAM cells should hold their stored logic states despite possible changes in voltage, temperature, or other operating conditions. Unfortunately, existing SRAM cell designs often fail to provide high degrees of read stability.

As SRAM cell operating voltages are reduced, the internal nodes of the SRAM cell may be vulnerable to read disturbance. For example, during a read operation, the internal SRAM nodes may be inadvertently charged through the access transistors to rise above a trip voltage of the SRAM cell, thereby causing the SRAM cell to inadvertently switch logic states.

The Static Noise Margin (SNM) is a "figure of merit" which measures read stability and read margin. See Benton H. Calhoun and Anantha Chandrakasan, *Analyzing Static Noise Margin for Sub-threshold SRAM in 65 nm CMOS*, http://www-mtl.mit.edu/researchgroups/icsystems/pubs/conferences/2005/bcalhoun_esscirc2005_paper.p df (September 2005). See also Evert Seevinck, Frans J. List, Jan Lohstroh, *Static-Noise Margin Analysis of MOS SRAM Cells*, IEEE JOURNAL OF SOLID-STATE CIRCUITS, Vol. SC-22, No. 5, pp. 748-754 (October 1987).

Essentially, designers aim for the most symmetrical SNM curve that is possible, with the widest "eye." The "eye" is the gap between the lowest logic high and the highest logic low voltages that form the SNM curve. A symmetrical SNM curve with a wide "eye" represents strong read stability, optimal read margin, and minimal read disturbance. Conversely, an asymmetrical graph with a reduced eye represents low read stability, minimal read margin, and high read disturbance. Therefore, to improve read margin, a designer's goal is to achieve a symmetrical SNM curve with the widest eye possible.

To minimize read disturbance, increase read stability, improve read margin, and improve the SNM, a designer can reduce the ratio between the sizes of the NMOS driver transistor and the NMOS pass transistor in a SRAM cell. However, when NMOS transistors are manufactured in a modem manufacturing process (e.g. a 65 nm process), the variation from the desired ratio between the driver and the pass transistor can be significant. For example, in NMOS transistors manufactured in a 65 nm process, the variation from the desired ratio can be as large as 10:1. These large variations lead to differences in resistance, channel length, threshold voltage, and other device characteristics. Large variations in size ratios and device characteristics are a major cause of low read stability.

In one approach to reduce read disturbance, improve read stability, and increase read margin, an additional pair of PMOS transistors is added to the SRAM cell so that the overall ratio of the PMOS transistors to the NMOS transistors in the SRAM cell is minimized. The additional pair of PMOS transistors also makes the SNM curve symmetrical, resulting in a wider "eye." This approach tries to minimize the variation in size ratio between the NMOS driver and pass transistors by counter-balancing voltages in the SRAM cell. Although adding a pair of PMOS transistors alleviates the problem slightly, such an approach has its own drawbacks. The PMOS transistors eventually get so strong that they pull nodes in the SRAM cell high when they should not be pulled high, leading to poor read stability.

In another approach to reduce read disturbance and improve read stability, the variations in device characteristics are reduced by a "Dual Stress Layer" in selected transistors (e.g. a pass gate transistor) of a SRAM cell. See Shou-Gwo Wuu, Jin-Yuan Lee, Dun-Nian Yaung, Jeng-Han Lee, U.S. Pat. No. 6,635,936 ("SRAM Layout for Relaxing Mechanical Stress in Shallow Trench Isolation Technology"); Mark Craig, Karsten Wieczorek, Manfred Horstmann, WO/2007/018780 ("SRAM Devices Utilizing Tensile-Stressed Strain Films"). However, this approach restricts the variations in device characteristics only from a device physics perspective. This approach does not address the larger problem of voltage and size ratio variance in a SRAM cell that leads to read instability, higher read disturbance, and a lower SNM.

As can be seen, both adding a pair of PMOS transistors and a solution aimed at altering the device characteristics of SRAM transistors are problematic.

SUMMARY OF THE INVENTION

Therefore, there exists a need in the art to increase read stability, decrease read disturbance, improve the SNM, and improve read margin for an SRAM memory cell. To meet this need, some embodiments of this invention provide a memory device that includes: a reference voltage; a first and a second power supply line; a static random access memory (SRAM) cell with cross-coupled first and second logic gates, with the first power supply line and the second power supply line respectively supplying the first and the second logic gates; and an elastic power header device provides, during a write operation of the first SRAM cell, different power levels on the first power supply line and the second power supply line and that provides, during a read operation, a programmable resistance in the first power supply line and the second power supply line.

Further to meet this need, other embodiments of this invention provide an elastic power header device that provides a memory device with a first and second power supply lines. The elastic power device includes: (1) a first path having first and second power differences between a reference voltage and, respectively, the first and second power supply lines; (2) second and third paths that are coupled between the reference voltage and, respectively, the first and second power supply lines wherein, during a write operation, resistance in either the second path or the third path is varied to provide a power difference between the first and second power supply lines; and (3) fourth and fifth paths that are coupled between the reference voltage and, respectively, the first and second power supply lines wherein, during a read operation, a programmable resistance is provided in a selected one of the fourth path or the fifth path.

Various embodiments of this invention include methods of operating the above or similar memory devices, and computer-readable media that use hardware description languages (HDLs) to describe the above or similar memory devices.

BRIEF DESCRIPTION OF THE FIGURES

To allow cross-referencing among the figures, like elements in the figures are provided like reference numerals.

DETAILED DESCRIPTION

In accordance with the present invention, an elastic power header device improves the read margin and read stability of a memory cell, such as an SRAM cell. In particular, an elastic power header device described herein acts as a programmable resistance to allow the power supply lines to reach a voltage equal to a desired reference voltage, without experiencing a threshold voltage drop. Therefore, an elastic power header device of the present invention provides additional flexibility in both read margin and read stability. The additional flexibility may also be varied with an adjustment voltage, which can be used to fine-tune and control the read margin.

Figure 1:
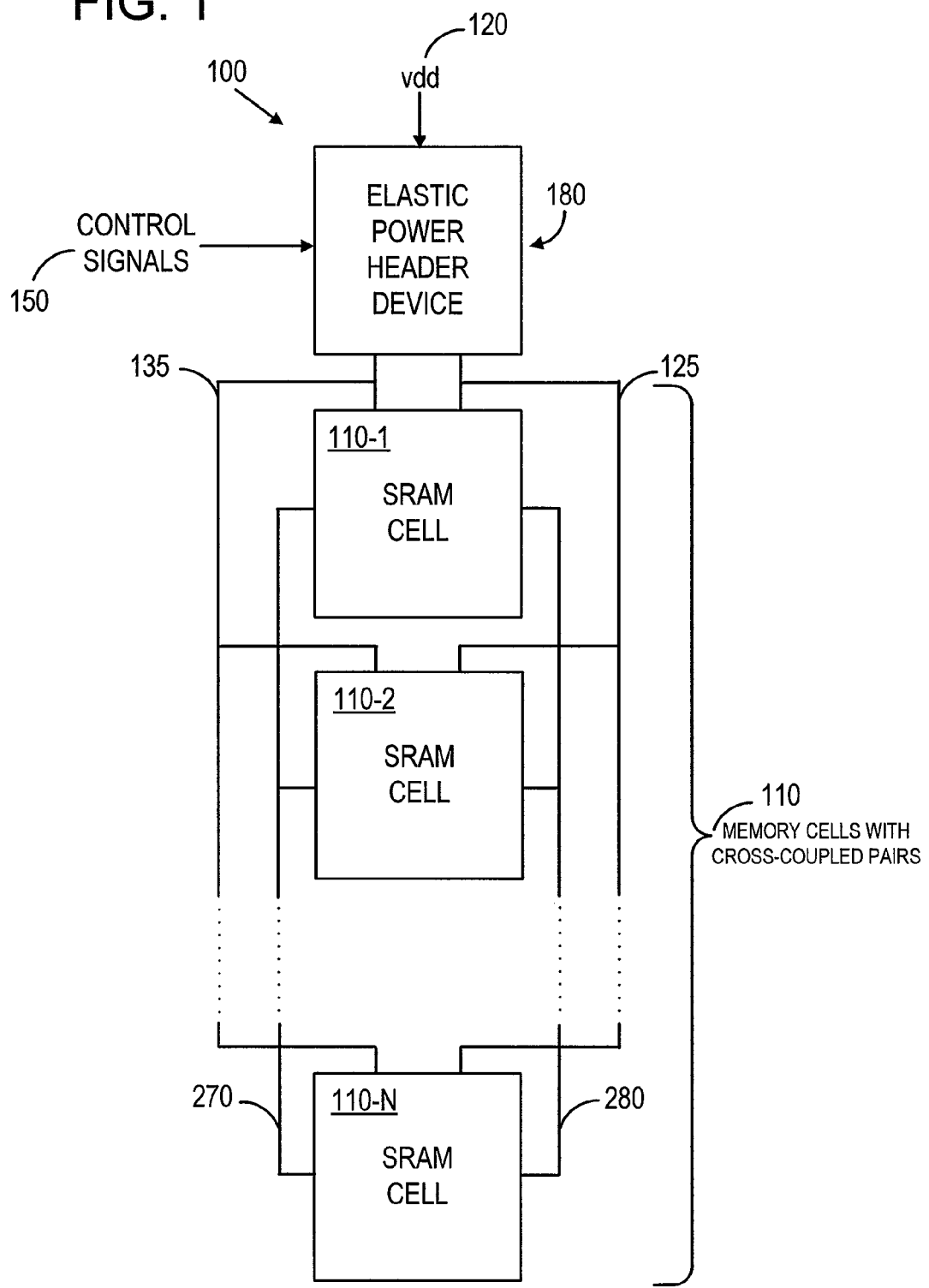
FIG. 1 is a conceptual block diagram showing circuit 100, in which a number of SRAM cells are connected to an elastic power header device, in accordance with one embodiment of the invention.
Figure 3:
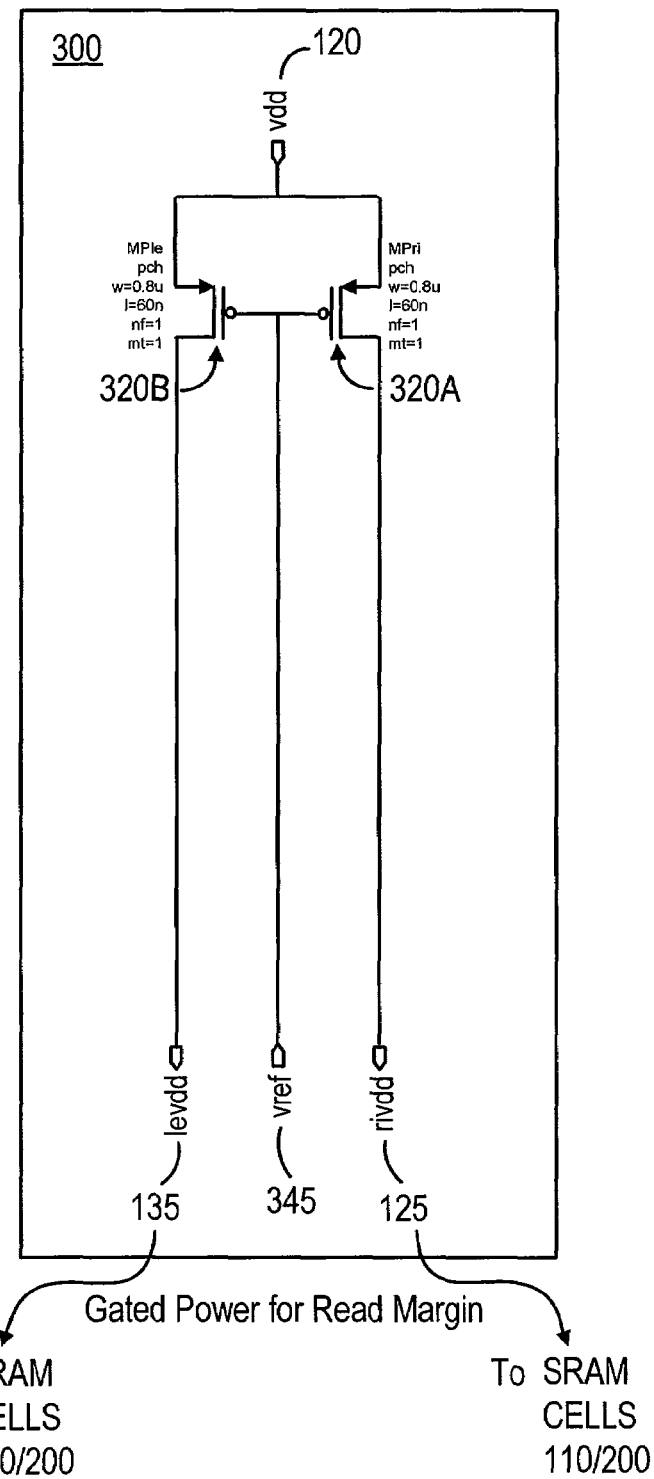
FIG. 3 illustrates circuit 300, which implements an elastic power header device in accordance with an embodiment of the invention.
Figure 4:
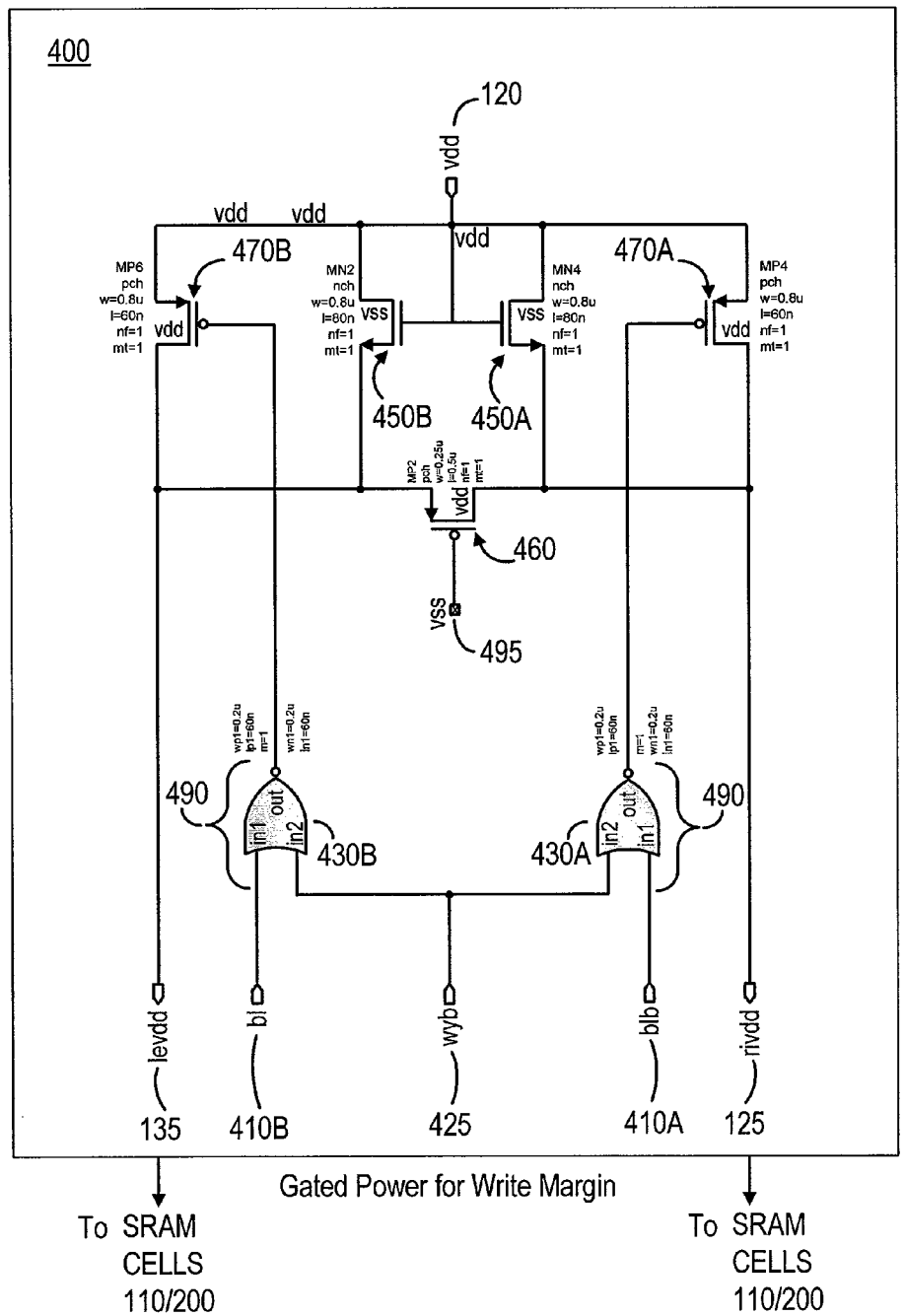
FIG. 4 illustrates circuit 400, which may be also be used to implement elastic power header device 180 of FIG. 1, in accordance with another embodiment of the invention.
Figure 5:
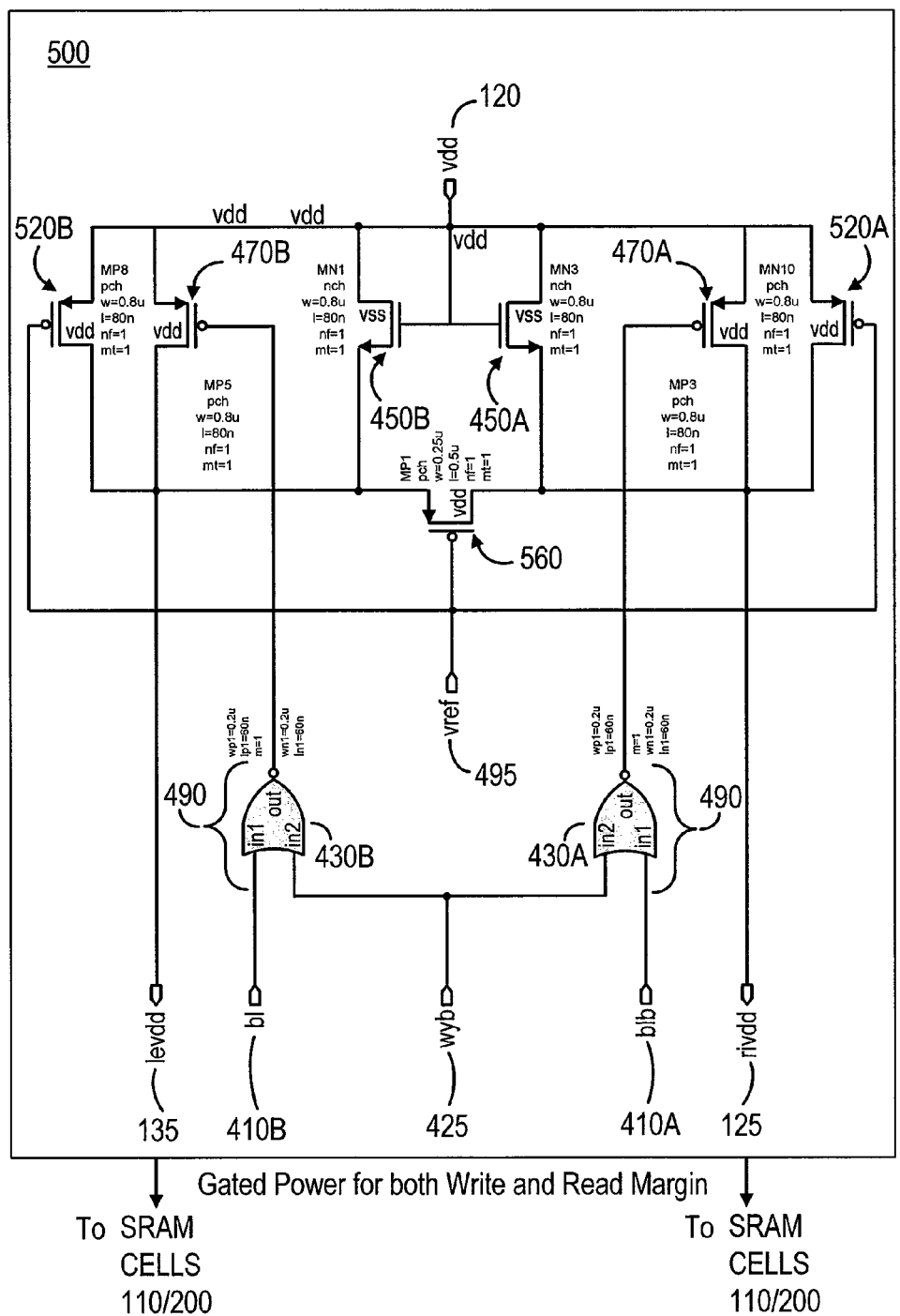
FIG. 5 illustrates circuit 500, which implements elastic power header device 180 of FIG. 1, in accordance with another embodiment of the invention.

FIG. 1 is a conceptual block diagram showing circuit 100, in which a number of SRAM cells 110 are connected to elastic power header device 180, in accordance with an embodiment of the invention. Several possible circuit implementations for elastic power header device 180 are illustrated in FIGS. 3 through 5, as further described herein.

As also shown in FIG. 1, bit lines 270 and 280 are connected with each of SRAM cells 110-1 through 100-N. In this regard, SRAM cells 110-1 through 110-N may share bitlines 270 and 280. However, in other embodiments, bit lines may not be shared by all of SRAM cells 110-1 through 110-N. For example, in one embodiment, a first set of bit lines may be provided to SRAM cells 110-1 and 110-2, and a second set of bit lines may be provided to SRAM cell 110-N. In such an embodiment, SRAM cells 110-1 and 110-2 may use bit lines separate from those used by SRAM cell 110-N. In other embodiments, any desired combination of shared and/or unshared bit lines may be used.

In FIG. 1, SRAM cells 110 are each connected to power supply lines 125 and 135. In one embodiment, each of SRAM cells 110 may be implemented by cross-coupled logic gates (e.g., cross-coupled inverters). Elastic power header device 180 may also act as "split power switch" that provide voltages of power supply lines 125 and 135 from power supply voltage 120 ("$V_{dd}$") Split power switches are discussed, for example, in U.S. patent application, entitled "Split Power Switch for Memory Cells" ("Copending Application"), Ser. No. 60/888, 006, filed on Feb. 2, 2007. In a split power switch, voltages of power supply lines 125 and 135 are slightly different, to facilitate writing into an SRAM cell. The disclosure of the Copending Application is hereby incorporated by reference to provide background for the split power technique.

Although SRAM cells 110 are shown in FIG. 1 as a single column of memory cells connected to a single split power switch 140, it is understood that FIG. 1 is merely illustrative. In a typical implementation, additional groups of SRAM cells 110 connect to power supply lines 125 and 135, and additional elastic power header devices 180 may be used to provide power to these additional groups of SRAM cells. Alternatively, the additional SRAM cells may share power supply lines 125 and 135 under control by a single elastic power header device 180. Furthermore, the single column of memory cells may be split into multiple sub-columns, each sub-column having its own power supply lines 125 and 135 but sharing the same bit line.

Elastic power header device 180 selectively adjusts the voltages provided to power supply lines 125 and 135, in response to one or more control signals 150. In one embodiment, elastic power header device 180 may be configured to provide substantially reference voltage 120 during a read operation, while allowing the voltage of one of power supply lines 125 and 135 to fall during an appropriate write operation of SRAM cells 110.

Figure 2:
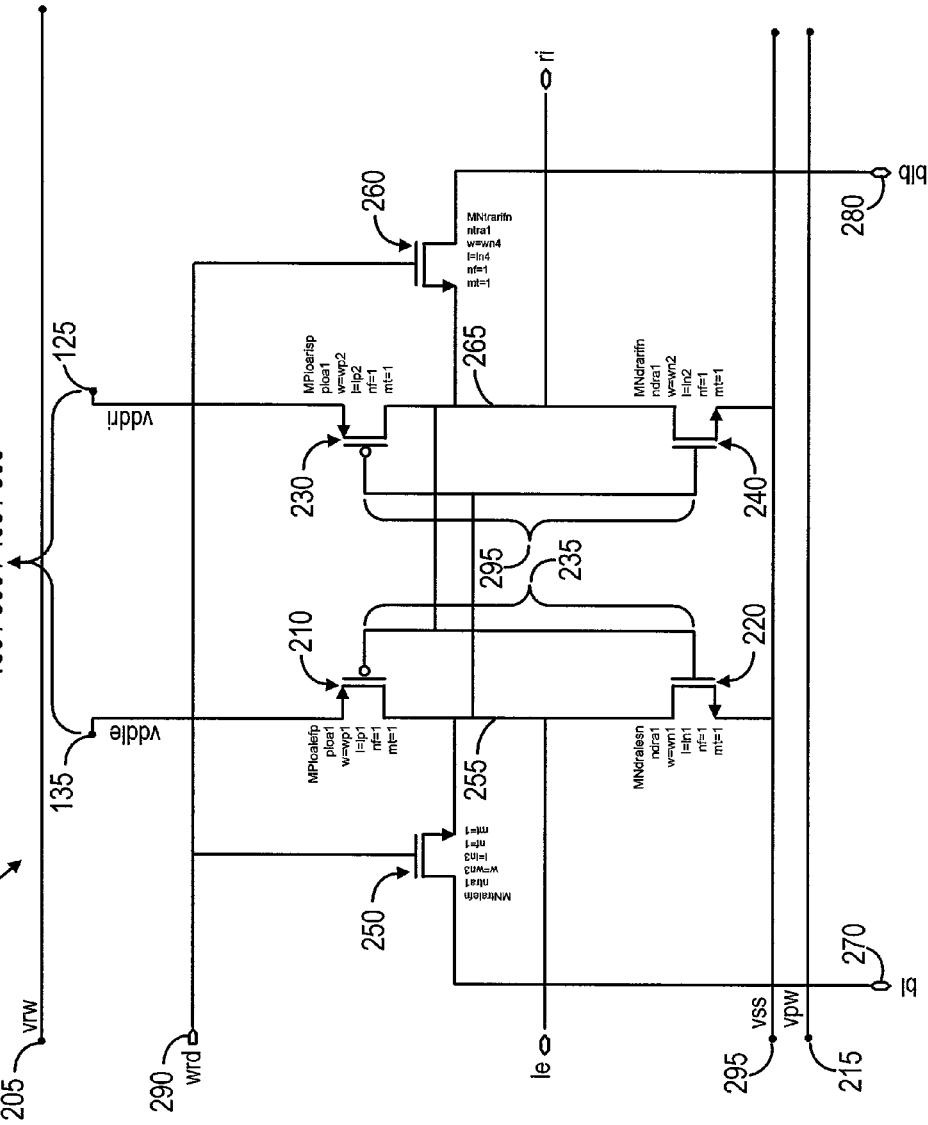
FIG. 2 shows circuit 200, which implements an SRAM cell suitable for use as any of SRAM cells 110 of FIG. 1, in accordance with an embodiment of the invention.

FIG. 2 shows circuit 200, which implements an SRAM cell that is suitable for use as any of SRAM cells 110 of FIG. 1, in accordance with an embodiment of the invention. As shown in FIG. 2, circuit 200 includes cross-coupled inverters 225 and 245 implemented by PMOS transistors 210 and 230 and NMOS transistors 220 and 240, respectively. PMOS transistor 210 connects to power supply line 135, while PMOS transistor 230 connects to power supply line 125. NMOS transistors 220 and 240 each connect to reference voltage 295 ("$V_{ss}$") which may correspond, for example, to ground. FIG. 2 further shows that n-well and p-well voltages 205 and 215 (labeled $V_{nw}$ and $V_{pw}$, respectively), each may differ from either reference voltage 120 or reference voltage 295. The n-well voltage 205 must be greater than or equal to the maximum of power supply lines 125 or 135. The n-well voltage is often the same line as reference voltage 120 (Vdd). The n-well voltage 205 is not the same line as either power supply lines 125 or 135, but it may happen to have the same voltage as power supply lines 125 or 135.

Access or pass transistors 250 and 260 connect to word line 290 and bit lines 270 and 280, and internal nodes 255 and 265, respectively. In circuit 200, to maintain a stored logic state, elastic power header device 180 provides that the voltage of each of power supply lines 125 and 135 is approximately reference voltage 120. During a read operation, elastic power header device 180 maintains each of power supply lines 125 and 135 at approximately reference voltage 120. During a read operation, bit lines 270 and 280 are precharged to an intermediate voltage, and word line 290 may then be set to a logic high voltage, so that access transistors 250 and 260 becomes conducting to allow inverters 225 and 245 to drive the stored logic values at nodes 255 and 265 to bit lines 270 and 280.

During a write operation, to allow a logic state represented by a higher voltage ("logic high") to be establish in node 255 (relative to the voltage representing the opposite logic state ("logic low") to be established in node 265), elastic power header device 180 permits the voltage of power supply line 125 to fall below reference voltage 120, while maintaining the voltage of power supply line 135 at approximately reference voltage 120. In this example, nodes 255 and 265 are initially at logic low and logic high, respectively. In that logic state, NMOS transistor 220 and PMOS transistor 230 are conducting, while PMOS transistors 210 and NMOS transistor 240 are non-conducting. During the write operation, bit lines 270 and 280 are driven to logic high and logic low, respectively, by appropriate write circuitry (not shown), as word line 290 is driven to logic high to turn on access transistors 250 and 260. Accordingly, bit line 280 pulls node 265 down from logic high to logic low. Because PMOS transistor 230 is initially conducting, its current acts to pull up the voltage at node 265. However, with power supply line 125 falling below reference voltage 120, resulting in a lesser current flowing in transistor 230 than would otherwise flow, bit line 280 can more rapidly turn on PMOS transistor 210 which, in turn, turns on NMOS transistor 240 to pull down node 265. By maintaining the voltage of power supply line 135 approximately at reference voltage 120, transistor 210 allows the voltage at node 255 to be more rapidly pulled up.

Selectively reducing the voltage at power supply line 125 during a write operation does not degrade the switch points of inverters 225 and 245. Even though PMOS transistor 230 on the side of the SRAM cell being pulled to logic low continues to operate in a linear mode (e.g., operating substantially as a resistor), the supply voltage at power supply line 135 is not reduced. As a result, a sufficient write current is provided to turn on NMOS transistor 240 to rapidly lower the voltage of node below the switch point of the inverter to properly regenerate a newly logic state in circuit 200.

As one would learn from the above description, writing the opposite logic state (i.e., to bring node 255 to logic low and node 265 to logic high) may be facilitated by allowing power supply line 135 to fall below reference voltage 120, while maintaining power supply line 125 at approximately reference voltage 120.

FIG. 3 illustrates circuit 300, which implements an elastic power header device (e.g., elastic power header device 180 of FIG. 1), in accordance with an embodiment of the invention. Circuit 300 improves read margin. Circuit 300 includes resistive transistors 320A and 320B, which connect reference voltage 120 to power supply lines 125 (labeled "levdd") and 135 (labeled "rivdd"), respectively. Transistors 320A and 320B are shown in FIG. 3 as being implemented by PMOS transistors. Adjustment voltage 345 (labeled "vref"), provided at the gate electrodes of resistive transistors 320A and 302B, adjusts the effective resistance of transistors 320A and 320B. Because of this resistance, during a read operation, a node that should not be pulled up is less likely to be pulled up, thereby avoiding read disturbance. To improve read margin, adjustment voltage 345 (1) may be fixed at a predetermined voltage, (2) may be a dynamically adjusted voltage, or (3) may be controlled by a thermal-sensing self-calibration circuit to automatically adjust to a proper voltage.

When maintained in the linear region, resistive transistors 320A and 320B can each pull power supply lines 125 and 135 to reference voltage 120. Within this region, the adjustment voltage 345 flexibly fine-tunes main resistive transistors 320A and 320B to be as close to reference voltage 120 as desired, taking into consideration the current drawn by the switching SRAM cell, thereby achieving improved read margin and increased read stability. Adjustment voltage 345 may also be used effectively to improve write margin in a write operation, as illustrated by FIG. 5.

FIG. 4 illustrates circuit 400, which may be also be used to implement elastic power header device 180 of FIG. 1, in accordance with another embodiment of the invention. Circuit 400 improves write margin.

Circuit 400 receives write data signals 410A (labeled "blb") and 410B (labeled "bl"), and a write enable signal 425 (labeled "wyb"). Signals 410A, 410B and 425 selectively adjusts the voltages at power supply lines 125 and 135 through logic circuit 490, which includes NOR gates 430A and 430B. NOR gates 430A and 430B controls gate electrodes of transistors 470A and 470B.

Transistors 450A, 450B, 470A and 470B connect power supply lines 125 and 135, respectively, to reference voltage 120. Each of transistors 470A and 470B selectively provides reference voltage 120 to power supply lines 125 and 135, respectively, in response to signals 410A-B and 425.

In FIG. 4, NOR gate 430A provides a logic low output value, except when write data signal 410A and write enable signal 425 are both at logic low. Similarly, NOR gate 430B provides a logic low output, except when write data signal 410B and write enable signal 425 are both at logic low. Thus, both transistors 470A and 470B remain turned on except during write operations, at which time one turns off to permit the voltage of one of power supply lines 125 or 135 to drop. Alternatively, other than in a write operation, write enable signal 425 is at logic high, so that transistors 470A and 470B are both conducting to maintain power supply lines 125 and 135 at reference voltage 120.

Circuit 400 also includes damper transistors 450A and 450B, shown in FIG. 4 as being implemented by NMOS transistors. As shown in FIG. 4, the gate and drain terminals of damper transistors 450A and 450B connect to reference voltage 120, so that power supply lines 125 and 135 are maintained approximately at reference voltage 120 minus a threshold voltage. Accordingly, damper transistors 450A and 450B each maintain a minimum voltage at the corresponding one of power supply lines 125 and 135, when transistors 470A or 470B is turned off in response to signals 410A, 410B and 425.

If write data signals 410A and 410B are implemented as complementary signals during a write operation (when write enable signal 425 is at logic low), only one of transistors 470A and 470B is conducting. For example, when write data signal 410A is at logic high (write data signal 410B is at logic low) value in a write operation, NOR gate 430A provides a logic low value to maintain transistor 470A conducting, while switching off transistor 470B. As a result, power supply line 125 remains at substantially reference voltage 120, while power supply line 135 falls to reference voltage 120 minus the threshold voltage of transistor 450B. As described above, the voltage difference in power supply lines 125 and 135 facilitates the write operation in the selected memory cell.

Circuit 400 also includes weak keeper transistor 460 having its gate electrode controlled by reference voltage 495, which may be the ground reference in this embodiment. As a result, weak keeper transistor 460 provides a weak current flowing between power supply lines 125 and 135 to limit the voltage difference between power supply lines 125 and 135, in response to leakage currents in SRAM circuit 200.

FIG. 5 illustrates circuit 500, which implements elastic power header device 180 of FIG. 1, in accordance with another embodiment of the invention. Circuit 500 improves both read margin and write margin. As shown in FIG. 5, circuit 500 includes, in addition to the elements of circuit 400 of FIG. 4, additional resistive transistors 520A and 520B (shown implemented by PMOS transistors) are respectively provided across reference voltage 120 and a corresponding one of power supply lines 125 and 135. To simplify the discussion herein, like elements in circuits 400 and 500 are provided the same reference numerals.

When adjustment voltage 495 is provided such that resistive transistors 520A and 520B are turned off, circuit 500 behaves substantially the same as circuit 400. Such an adjustment voltage may be provided during a write operation so that, as explained above, circuit 500 may improve write margin in the same manner as circuit 400. However, if the adjustment voltage 545 is set so that resistive transistors 520A and 520B are turned on in the linear region, during a read operation, while at the same time signals 410A, 410B and 425 are kept at logic low, then circuit 500 operates similar to circuit 300, i.e., with the benefit of an improved read margin. Outside of the read and write operations, transistor 470A and 470B remain conducting, so that power supply lines 125 and 135 are at substantially reference voltage 120 to ensure that the stored value in the SRAM cells maintain a high immunity to noise. In this manner, circuit 500 provides both improved read margin and improved write margin.

Figure 6:
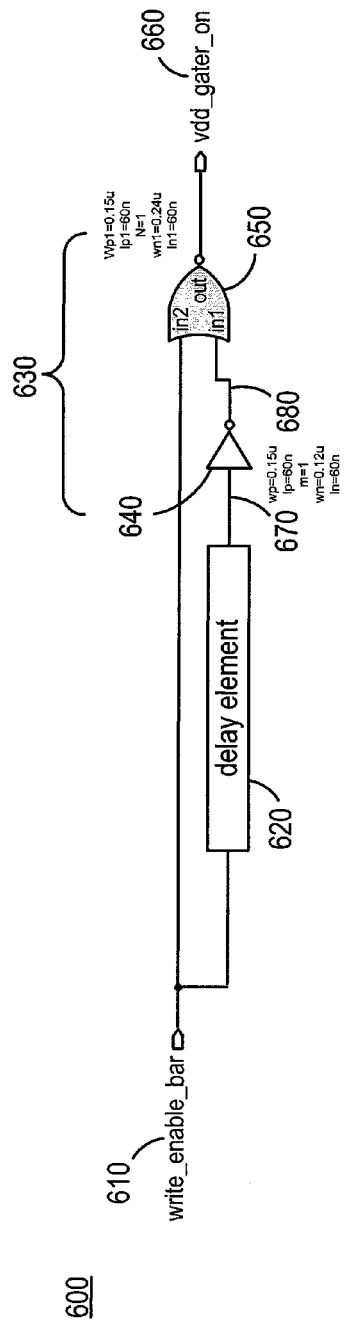
FIG. 6 shows circuit 600, which provides a low-going pulse, which may be used to provide write enable signal 425 during a read or write operation in elastic power header circuit 180 of FIG. 1, in accordance with an embodiment of the invention.

FIG. 6 shows circuit 600, which provides a low-going pulse, which may be used to provide write enable signal 425 a logic low state of sufficient duration during a read or write operation in elastic power header circuit 180 of FIG. 1, in accordance with an embodiment of the invention. Circuit 600 includes a delay element block 620 implemented by appropriate circuitry to delay the input signal, so that, for a brief time period, because of inverter 640, a high-going signal transition at input terminal 610 causes output terminal 660 of NAND gate 650 to go to logic low. At other times, inverter 640 ensures that output terminal 660 of NAND gate 650 is at logic high.

Embodiments incorporating various features disclosed herein may be implemented in embedded or standalone SRAM memory devices, caches, register files, multi-port memories, translation lookaside buffers (TLBS), content-addressable memories (CAMS), ternary CAMS (TCAMS), or other appropriate devices to operate at lower voltages as compared to traditional six transistor SRAM cells. Such features can be particularly advantageous for mobile, portable, or ultra-low voltage devices in which lower supply voltages may advantageously permit longer battery life and/or use time.

Figure 7:
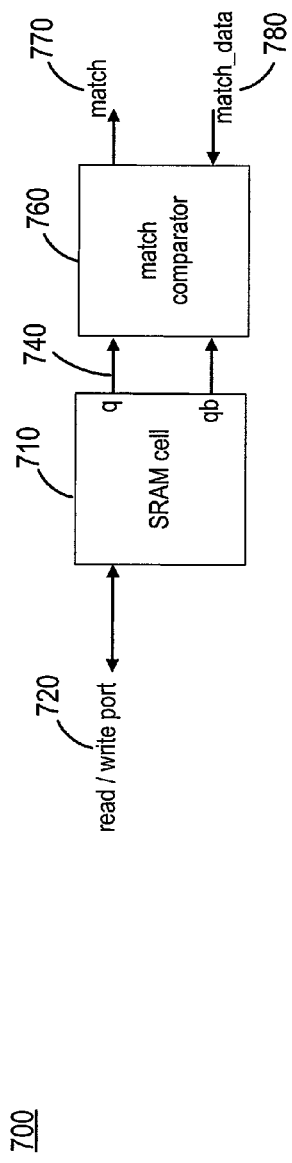
FIG. 7 illustrates an example of a content-addressable memory (CAM) cell that may be implemented using the SRAM cell circuits disclosed above.

FIG. 7 illustrates an example of a content-addressable memory (CAM) cell that may be implemented using the SRAM cell circuits disclosed above. In FIG. 7, CAM memory device 700 includes SRAM cell 710 and match comparator 760. SRAM cell 710 may be implemented, for example, by circuit 200 of FIG. 2. As shown in FIG. 7, SRAM cell 710 includes a read/write port 720 implemented, for example, by access transistors 250 and 260 of circuit 200. A logic state and its complement stored in SRAM cell 710 are provided to match comparator 760 (e.g., as bit lines 270 and 280 of circuit 200). Match comparator 760 compares a data value received at match-data port 780 against the value stored in SRAM cell 710 to provide an output value for match signal 770.

In one embodiment of the invention, the elastic power header device includes transistors and an adjustable bias to mimic a programmable resistor. Adjustment can be continuously adjustable or step-wise adjustable. The adjustment bias can also be either an adjustable current or an adjustable voltage, even though it will be referred to as an adjustment voltage hereafter. This transistor and adjustment voltage combination is utilized in an SRAM cell for read operations. A transistor can be held to operate at an adjustable strength such as in linear or saturation region by an adjustment voltage. This in turn varies the resistance in the transistor and allows the voltage on a power supply line to approximate a reference voltage, for instance, $V_{dd}$. The resistance of the elastic power header device can also be made programmable. Properties of the elastic power header device may be programmed before processing, or set "on-the-fly." This implementation improves the read margin of the SRAM cell.

In another embodiment, the elastic power header device includes actual programmable resistors, instead of transistors, which have resistance values that may be varied in a SRAM cell during a read. The read margin of the SRAM cell is thereby improved.

In another embodiment, the elastic power header device includes transistors and a logic circuit used during a write operation. The transistors and the logic circuit act like a switch to affect the relative resistances in split-power lines. In this manner, the write operation is optimally performed, thereby improving the write margin of the SRAM cell.

In another embodiment of the present invention, the elastic power header device includes transistors, an adjustment voltage, and a logic circuit to be used during both a read operation and a write operation. In this manner, the elastic power header device improves both the read margin and the write margin of the SRAM cell.

According to another embodiment of the invention, the elastic power header device splits the power supply into two power supply lines using a programmable resistor to control the effective resistances in the split power lines. One advantage of such an elastic power header device is improved read margin achieved by improving read stability, reducing read disturbance and improving SNM. The elastic power header device also improves both the read and write margin of the SRAM cell simultaneously.

Additional embodiments of the invention provide elastic power header devices in other devices, such as flash memories, to the extent that this invention helps with problems seen in practice. These and other features and advantages of the invention will be more readily apparent from the detailed description of the embodiments set forth below taken in conjunction with the accompanying drawings.

The elastic power header device in accordance with the various embodiments described herein may be used with SRAM cells providing multiple bidirectional or unidirectional read or write ports. In addition, although a positive reference voltage 120 has been described herein, the techniques of the invention are equally applicable when applied to a negative reference voltage (e.g., ground). Advantageously, the embodiments of the invention, including the various circuits for implementing elastic power header device 180 described herein can provide reliable voltage operation ranges for the connected SRAM cells, despite possible variations in individual circuit components.

As known by one of ordinary skill in the art, this invention, including any logic circuit or transistor circuit, may be modeled, generated, or both by computer based on a description of the hardware expressed in the syntax and the semantics of a hardware description language (HDL). Such HDL descriptions are often stored on a computer readable medium. Applicable HDLs include those at the layout, circuit netlist, register transfer, and/or schematic capture levels. Examples of HDLs include, but are not limited to: GDS II and OASIS (layout level); various SPICE languages, and IBIS (circuit netlist level); Verilog and VHDL (register transfer level); and Virtuoso custom design language and Design Architecture-IC custom design language (schematic capture level). HDL descriptions may also be used for a variety of purposes, including but not limited to layout, behavior, logic and circuit design verification, modeling and/or simulation.

The foregoing disclosure is not intended to limit the invention to the precise forms or particular fields of use disclosed. Various alternate embodiments, variations or modifications to the invention are possible within the scope of the invention in light of the disclosure. The invention is set forth in the following claims.

We claim:

1. A memory device comprising:
   a first power supply line;
   a second power supply line;
   a static random access memory (SRAM) cell comprising a first logic gate and a second logic gate that are cross-coupled, wherein the first power supply line supplies the first logic gate, and the second power supply line supplies the second logic gate; and
   an elastic power header device connected between a reference voltage and each one of the first power supply line and the second power supply line,
   wherein the elastic power header device is configured to provide, during a write operation of the SRAM cell, different power supply levels on the first power supply line and the second power supply line and is configured to provide, during a read operation, a first resistance in the first power supply line and a second resistance in the second power supply line, and
   wherein the elastic power header device is configured to receive one or more write data signals and a write enable signal through a logic circuit and to selectively adjust the power supply levels on the first power supply line and the second power supply line based on an output of the logic circuit.

2. The memory device of claim 1, wherein at least one of the first and second resistances comprises a programmable resistance.

3. The memory device of claim 1 wherein, during the write operation, the first power supply line has a different voltage level than the second power supply line.

4. The memory device of claim 1 wherein, during the write operation, the first power supply line has a different current flow than the second power supply line.

5. The memory device of claim 1 wherein, during the write operation, the difference of the power supply levels is held at an adjustable strength according to a control signal.

6. The memory device of claim 1 wherein, during the write operation, which of the first and the second power supply lines has a higher power supply level is determined by the value of the data bit being written.

7. The memory device of claim 1 wherein, during the read operation, the first resistance and the second resistance are substantially equal, whereby a difference in power supply levels between the first power supply line and the second power supply line depends on the current drawn from each power supply line.

8. The memory device of claim 1 wherein, during the write operation, the different power supply levels are provided by a variable resistance in a selected one of the power supply lines to facilitate writing into the SRAM cell.

9. The memory device of claim 1, further comprising a transistor connected between the reference voltage and a selected one of the power supply lines, wherein the transistor is configured to provide the first resistance.

10. The memory device of claim 1, further comprising a transistor connected between the reference voltage and a selected one of the power supply lines, wherein the transistor is configured to provide the second resistance.

11. The memory device of claim 1, wherein the different power supply levels between the first power supply line and the second power supply line during the write operation corresponds to a threshold voltage drop across a transistor.

12. The memory device of claim 1, further comprising a keeper circuit for limiting a voltage difference between the first power supply line and the second power supply line.

13. The memory device of claim 1, wherein the memory device is configured for use in at least one of: an embedded SRAM memory device, a standalone SRAM memory device, a cache, a register file, a multi-port memory, a translation lookaside buffer, a content-addressable memory, or a ternary content-addressable memory.

14. A method for achieving improved read and write margins in a memory device comprising a first power supply line, a second power supply line, and a first logic gate and a second logic gate that are cross-coupled, the method comprising:
   maintaining, during a read operation of the memory device, a resistance in each one of the first power supply line and the second power supply line to provide a power supply level greater than a predetermined value; and
   varying, during a write operation of the memory device, a resistance in a selected one of the first power supply line and the second power supply line to provide a power supply level difference between the first power supply line and the second power supply linen,
   wherein the varying comprises:
      receiving one or more write data signals and a write enable signal through a logic circuit; and
      selectively adjusting the power supply levels on the first power supply line and the second power supply line based on an output of the logic circuit.

15. The method of claim 14, wherein the resistance comprises a programmable resistance.

16. The method of claim 14, wherein the power supply level comprises a voltage.

17. The method of claim 14, wherein the power supply level comprises a current.

18. The method of claim 14, further comprising controlling a device configured to achieve a resistance.

19. The method of claim 14, further comprising varying a conductance of a transistor connected between a reference voltage and the selected one of the first power supply line and the second power supply line.

20. The method of claim 14, further comprising equalizing the first power supply line and the second power supply line at a time when neither of the read or the write operations is occurring.

21. An elastic power header device for providing a first power supply line and a second power supply line in a split power fashion to a memory device, comprising:
   a first conductive path, coupled between a reference voltage and both the first power supply line and the second power supply line, configured to provide a first power supply level difference between the reference voltage and each one of the first power supply line and the second power supply line;
   a second conductive path, coupled between the reference voltage and the first power supply line;
   a third conductive path, coupled between the reference voltage and the second power supply line, wherein, in response to a read operation, a resistance in a selected one of the second conductive path or the third conductive path is kept within a predetermined range of values during a write operation to provide a power supply level difference between the first power supply line and the second power supply line;
   a fourth conductive path, coupled between the reference voltage and the first power supply line; and
   a fifth conductive path, coupled between the reference voltage and the second power supply line wherein, in response to a write operation, the resistance in a selected one of the fourth and the fifth conductive paths is varied to provide a resistance.

22. The elastic power header device of claim 21, wherein the resistance comprises a programmable resistance.

23. The elastic power header device of claim 21, wherein the first to fifth conductive paths each comprise a device controlled to operate at an adjustable strength.

24. The elastic power header device of claim 21, wherein the first to fifth conductive paths each comprise a transistor.

25. The elastic power header device of claim 21, wherein the fourth and fifth conductive paths are attenuated during a write operation.

26. The elastic power header device of claim 21, wherein the second and the third conductive paths are attenuated during a read operation.

27. The elastic power header device of claim 21, further comprising a keeper circuit for limiting the difference between the first power supply line and the second power supply line.

28. A computer-readable medium that includes a description of a circuit that implements an elastic power header device which includes a first power supply line and a second power supply line organized in a split power fashion in a memory device, where the circuit is adapted for use with a processor that executes operations that represent instructions, the instructions comprising:
   configuring a first conductive path coupled between a reference voltage and both the first power supply line and the second power supply line, configured to provide a first voltage between the reference voltage and each one of the first power supply line and the second power supply line;
   configuring a second conductive path, coupled between the reference voltage and the first power supply line;
   configuring a third conductive path, coupled between the reference voltage and the second power supply line, wherein, in response to a read operation, a resistance in a selected one of the second conductive path or the third conductive path is kept within a predetermined range of values during a write operation to provide a power supply level difference between the first power supply line and the second power supply line;
   configuring a fourth conductive path, coupled between the reference voltage and the first power supply line to provide a resistance in the first power supply line in response to a write operation; and
   configuring a fifth conductive path, coupled between the reference voltage and the second power supply line to provide the resistance in the second power supply line in response to a write operation.

29. The computer-readable medium as in claim 28, wherein the resistance comprises a programmable resistance.

30. The computer-readable medium as in claim 28, wherein the first to fifth conductive paths each comprise a device controlled to operate at an adjustable strength during a read operation.

31. The computer-readable medium as in claim 28, wherein the first to fifth conductive paths each comprise a transistor.

32. A computer readable medium that includes a description of a memory device, the memory device comprising:
   a first power supply line;
   a second power supply line;
   a static random access memory (SRAM) cell comprising a first logic gate and a second logic gate that are cross-coupled, wherein the first power supply line supplies the first logic gate, and the second power supply line supplies the second logic gate; and
   an elastic power header device connected between the reference voltage and each one of the first power supply line and the second power supply line,
   wherein the elastic power header device is configured to provide, during a write operation of the SRAM cell, different power supply levels on the first power supply line and the second power supply line and is configured to provide, during a read operation, a first resistance in the first power supply line and a second resistance in the second power supply line, and
   wherein the elastic power header device is configured to receive one or more write data signals and a write enable signal through a logic circuit and to selectively adjust the power supply levels on the first power supply line and the second power supply line based on an output of the logic circuit.

33. The computer-readable medium as in claim 32, wherein at least one of the first and second resistances comprises a programmable resistance.

34. A memory device comprising:
   means for providing a reference voltage;
   means for configuring a first power supply line and a second power supply line, and means for connecting a static random access memory (SRAM) cell comprising a first logic gate and a second logic gate that are cross-coupled, wherein the first power supply line supplies the first logic gate, and the second power supply line supplies the second logic gates; and
   means for providing elastic power connected between the reference voltage and each one of the first power supply line and the second power supply line providing, during a write operation of the SRAM cell, different power supply levels on the first power supply line and the second power supply line and, during a read operation, providing a first resistance in the first power supply line and a second resistance in the second power supply line,
   wherein the means for providing elastic power comprises receiving one or more write data signals and a write enable signal through a logic circuit and selectively adjusting the power supply levels on the first power supply line and the second power supply line based on an output of the logic circuit.

35. The memory device of claim 34, wherein at least one of the first and second resistances comprises a programmable resistance.

* * * * *

UNITED STATES PATENT AND TRADEMARK OFFICE
CERTIFICATE OF CORRECTION

PATENT NO. : 7,672,187 B2 Page 1 of 1
APPLICATION NO. : 11/932967
DATED : March 2, 2010
INVENTOR(S) : Lih et al.

It is certified that error appears in the above-identified patent and that said Letters Patent is hereby corrected as shown below:

Column 10 (line 19), please replace the word "linen" with --line--.

Signed and Sealed this

Twenty-seventh Day of April, 2010

David J. Kappos
*Director of the United States Patent and Trademark Office*